United States Patent [19]
Ito et al.

[11] Patent Number: 5,228,067
[45] Date of Patent: Jul. 13, 1993

[54] SEMICONDUCTOR INTEGRATED CIRCUIT

[75] Inventors: Takahiro Ito, Yokosuka; Toshihisa Inoue, Yokohama, both of Japan

[73] Assignee: Kabushiki Kaisha Toshiba, Kawasaki, Japan

[21] Appl. No.: 936,634

[22] Filed: Aug. 28, 1992

[30] Foreign Application Priority Data

Aug. 29, 1991 [JP] Japan ................................. 3-218476

[51] Int. Cl.$^5$ ............................................. H03L 7/18
[52] U.S. Cl. ..................................... 377/114; 377/111; 377/47; 377/48; 328/60; 328/61; 328/62
[58] Field of Search ................... 377/114, 111, 47, 48; 328/60, 61, 62

[56] References Cited

U.S. PATENT DOCUMENTS

| | | | |
|---|---|---|---|
| 4,165,490 | 8/1979 | Howe, Jr. et al. | 377/47 |
| 4,223,268 | 9/1980 | Shimizu | 328/48 |
| 4,658,406 | 4/1987 | Pappas | 377/114 |
| 4,695,804 | 9/1987 | Bardl et al. | 328/61 |

FOREIGN PATENT DOCUMENTS

| | | |
|---|---|---|
| 0303715 | 2/1989 | European Pat. Off. . |
| 3303133 | 8/1984 | Fed. Rep. of Germany . |
| 2176923 | 1/1987 | United Kingdom . |

OTHER PUBLICATIONS

Patent Abstract of Japanese Patent No. 59062933, publication date Oct. 4, 1984, Inventor: Akao Yasushi, Title: CMOS Data Processor.
Patent Abstract of Japanese Patent No. 62236212, publication date Oct. 16, 1987, Inventor: Oimura Katsuhiko, Title: Counter Device.

*Primary Examiner*—John S. Heyman
*Assistant Examiner*—Scott A. Ouelette
*Attorney, Agent, or Firm*—Oblon, Spivak, McClelland, Maier & Neustadt

[57] ABSTRACT

A semiconductor integrated circuit of this invention includes an oscillation circuit formed on a semiconductor substrate, a frequency dividing circuit formed on the semiconductor substrate, for dividing a frequency of an oscillation output from the oscillation circuit, clocked inverters for selectively permitting one of an original oscillation frequency signal of the oscillation circuit and outputs of the frequency dividing circuit to pass therethrough, an output circuit for outputting a signal selected by the clocked inverters, and a frequency dividing circuit controlling NAND circuit for interrupting the operation of the frequency dividing circuit while the original oscillation frequency signal of the oscillation circuit is being output from the output circuit.

5 Claims, 3 Drawing Sheets

SEMICONDUCTOR INTEGRATED CIRCUIT

BACKGROUND OF THE INVENTION

1. Field of the Invention

This invention relates to a semiconductor integrated circuit, and more particularly to a semiconductor integrated circuit having a CMOS crystal oscillator circuit and a frequency dividing circuit formed on the same semiconductor substrate.

2. Description of the Related Art

As shown in FIG. 1, a crystal oscillator circuit having a CMOS crystal oscillator circuit 1 and a frequency dividing circuit 9 for dividing the frequency of the crystal oscillation output formed on the same semiconductor substrate selects a signal having one of the original oscillation frequency fo and a divided frequency $fo/2^n$ and outputs the selected signal as an output in the prior art. In FIG. 1, a reference numeral 10 denotes a decoder, 11 an output circuit.

FIG. 2 shows an example of the circuit. In this example, the original oscillation circuit 1 is formed of a CMOS inverter 2, a feedback resistor 3 and an external circuit 7 which is constructed by a crystal oscillator 4 and pull-down capacitors 5 and 6. The original oscillation signal (frequency fo) of the circuit is input to a clocked inverter CI1 via a CMOS inverter 8 and to a frequency divider 9 (which is formed with a three stage construction in this example) via the inverter and signals of frequencies fo/2, fo/4 and fo/8 are output from the frequency divider 9. A desired one of the signals respectively having the original oscillation frequency fo, divided frequencies fo/2, fo/4 and fo/8 may be selected by inputting control signals A and B to the decoder 10, activating one of outputs C, D, E and F thereof and setting one of the clocked inverters CI1 to CI4 into the operative state by the activated output. The selected signal is derived from an output section via the 3-state output circuit 11. The potential of an oscillation interrupting terminal 13 is generally set to an "H (high)" level or power source level $V_{DD}$ by means of a pull-up resistor 14. If a signal of "L (low)" level or ground level is supplied to the oscillation interrupting terminal 13, the low level signal is supplied to an N-channel MOS transistor 16 for oscillation interruption via a CMOS inverter 15 to turn on the transistor 16 and set the potential of a node 17 to the "L" level, thereby interrupting the oscillation of the oscillation circuit 1. Further, the signal on the terminal 13 is input to a reset terminal R of the frequency divider 9 via the CMOS inverters 15 and 18 to interrupt the frequency dividing operation of the frequency divider 9. The signal is also input to a control terminal Co of the 3-state output circuit 11 via the CMOS inverters 15 and 18 to set the 3-state output circuit 11 to a high impedance state.

Since the frequency dividing circuit 9 is operated even when the oscillation output is selected by the clocked inverter CI1 in the circuit of FIG. 2, noise contained in the oscillation output is increased by the switching noise generated from the frequency dividing circuit 9. The reason is that the power source current is varied in the switching operation caused during the frequency dividing operation of the frequency dividing H circuit 9 and the power source $V_{DD}$ tends to be influenced by the generated noise. Particularly, in the integrated circuit, since the frequency dividing circuit 9, oscillation circuit 1 and inverter 8 connected between the frequency dividing circuit 9 and the oscillation circuit 1 commonly use the power source $V_{DD}$, the power source noise generated from the frequency dividing circuit 9 may influence the power source voltage of the oscillation circuit 1 and the like and the noise may be superposed on an oscillation signal output via the inverter 8, clocked inverter CI1 and output circuit 11. However, since the frequency dividing circuit 9 itself has a wave forming function, the noise contained in the output of the frequency dividing circuit 9 is extremely small.

SUMMARY OF THE INVENTION

An object of this invention is to provide a semiconductor integrated circuit which has an oscillator circuit and a frequency dividing circuit formed on the same semiconductor substrate and in which noise generated from the frequency dividing circuit can be suppressed and an output containing less noise can be obtained.

The above object can be attained by a semiconductor integrated circuit comprising a semiconductor substrate having an oscillation circuit and a frequency dividing circuit connected to a output line of the oscillation circuit formed thereon; signal selection means for selectively permitting one of an original oscillation frequency signal of the oscillation circuit and outputs of the frequency dividing circuit to pass therethrough; an output circuit for outputting a signal selected by the selection means; and operation interrupting means for interrupting the operation of the frequency dividing circuit while the original oscillation frequency signal of the oscillation circuit is being output from the output circuit.

With the above construction, when the original oscillation frequency signal is selected and output, the operation of the frequency dividing circuit which may cause noise is interrupted so that noise contained in the original oscillation frequency signal can be significantly reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

DETAILED DESCRIPTION OF THE PREFERRED EMBODIMENTS

Figure 1:
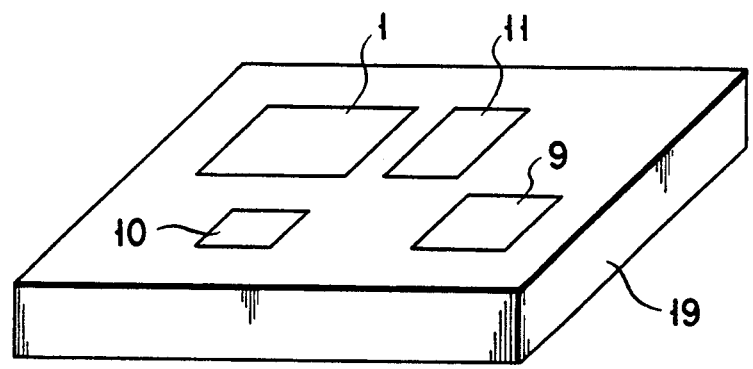
FIG. 1 is a perspective view of a semiconductor integrated circuit formed on a semiconductor chip formed of the same semiconductor substrate.
Figure 2:
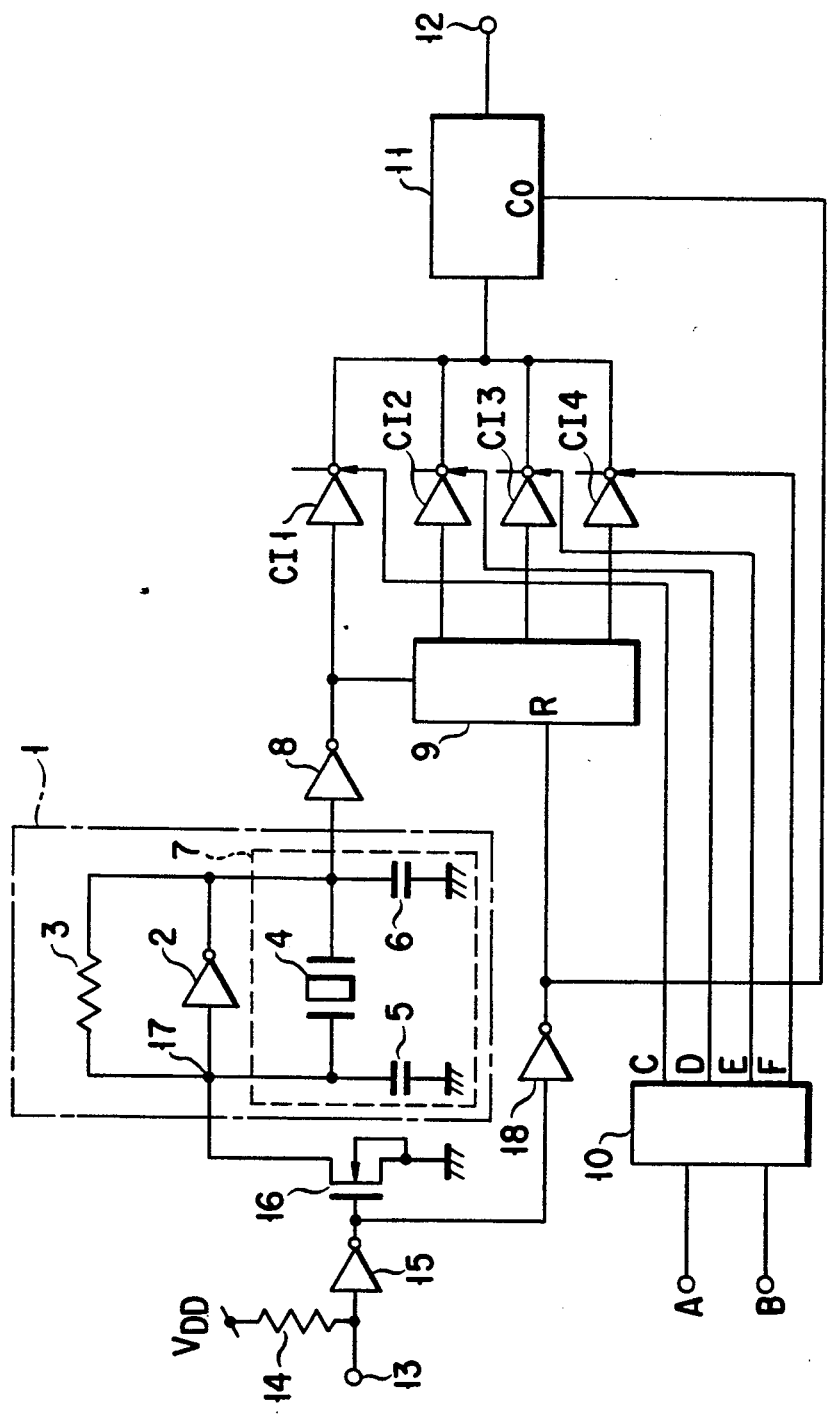
FIG. 2 is a circuit diagram showing the conventional semiconductor integrated circuit.
Figure 3:
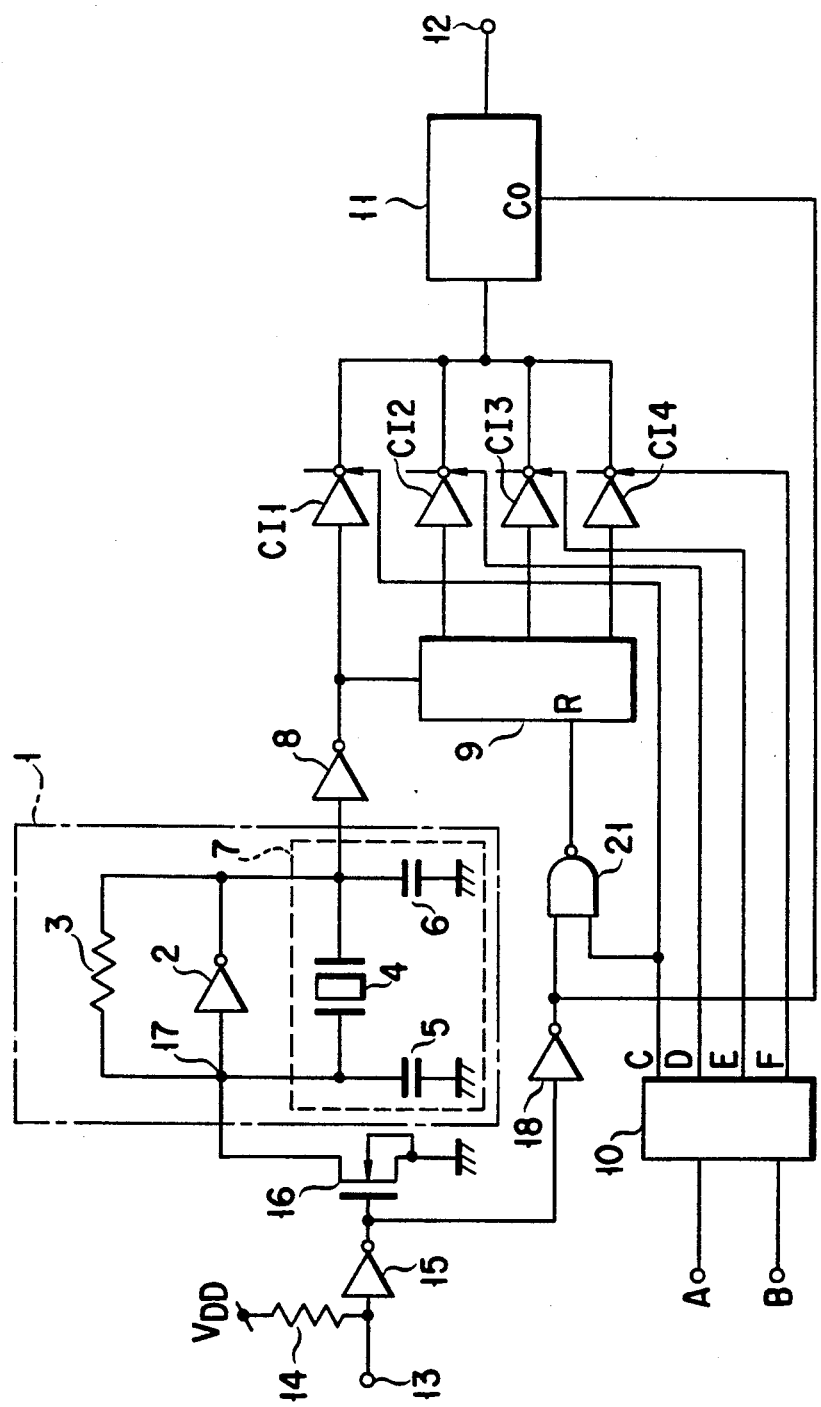
FIG. 3 is a circuit diagram showing a semiconductor integrated circuit according to one embodiment of this invention.

There will now be described an embodiment of this invention with reference to the accompanying drawings. FIG. 3 is a circuit diagram showing a semiconductor integrated circuit according to one embodiment of this invention and corresponding to that of FIG. 2, and like portions are denoted by the same reference numerals as those used in FIG. 2. In the circuit of FIG. 3, an original oscillation frequency signal (frequency fo) is generated from an original oscillation circuit 1 which is formed of a CMOS inverter 2, a feedback resistor 3 and an external circuit 7 which is constructed by a crystal oscillator 4 and capacitors 5 and 6. The original oscillation signal is amplified by a succeeding stage inverter 8 and then input to a clocked inverter CI1 and a frequency dividing circuit 9. Outputs of the frequency dividing circuit 9 respectively having a divided-by-2 frequency, divided-by-4 frequency and divided-by-8 frequency are respectively supplied to clocked inverters CI2, CI3 and CI4. The clocked inverters CI1 to CI4 are used to select one of the signals having the original oscillation frequency, divided-by-2 frequency, divided-by-4 frequency and divided-by-8 frequency according to output signals C, D, E and F which are generated from a decoder 10 in response to control signals A and B and supplies the selected signal to an output circuit 11 which in turn outputs the same as an output signal from a terminal 12.

In a case where the original oscillation frequency signal is selected by the clocked inverter CI1, the output C of the decoder 10 is set to the "H" level and the outputs D, E and F thereof are set to the "L" level so that only the clocked inverter CI1 can be operated as a normal inverter, thus permitting the original oscillation frequency signal to be output. At this time, the output C of the decoder 10 which is at the "H" level and a signal of "H" level supplied from an oscillation interrupting terminal 13 via inverters 15 and 18 are input to a NAND circuit 21. The NAND circuit 21 outputs an "L" level output which is in turn supplied to the reset terminal R of the frequency dividing circuit 9. The operation of the frequency dividing circuit 9 is interrupted. That is, when the original oscillation frequency signal is derived from the terminal 12 as an output signal, the operation of the frequency dividing circuit 9 is interrupted and no switching noise occurs, thereby stabilizing the power source voltage and preventing noise from being generated from the frequency dividing circuit 9. As a result, substantially no noise is superposed on the original oscillation frequency output and an erroneous operation by the noise will not occur.

This invention is not limited to the above embodiment and various modifications may be made. For example, the CMOS crystal oscillation circuit used in the above embodiment may be replaced by another oscillation circuit, and the NAND circuit 21 used as the frequency dividing operation interrupting means may be replaced by another suitable circuit means.

As described above, according to this invention, since the operation of the frequency dividing circuit is interrupted when the original oscillation frequency output is derived from the oscillation circuit, no noise is generated from the frequency dividing circuit, thereby making it possible to obtain an original oscillation frequency output having extremely less noise.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:
an oscillation circuit formed on a semiconductor substrate;
a frequency dividing circuit formed on said semiconductor substrate, for dividing a frequency of an oscillation output from said oscillation circuit;
signal selection means for selectively permitting one of an original oscillation frequency signal of said oscillation circuit and outputs of said frequency dividing circuit to pass therethrough;
an output circuit for outputting a signal selected by said selection means; and
operation interrupting means for interrupting the operation of said frequency dividing circuit while the original oscillation frequency signal of said oscillation circuit is being output from said output circuit.

2. A semiconductor integrated circuit according to claim 1, wherein said oscillation circuit and said frequency dividing circuit use the same power source.

3. A semiconductor integrated circuit according to claim 1, wherein a CMOS integrated circuit is formed on said semiconductor substrate.

4. A semiconductor integrated circuit according to claim 1, wherein said oscillation circuit is a CMOS crystal oscillation circuit.

5. A semiconductor integrated circuit according to claim 1, wherein said output circuit is a 3-state type output circuit.

* * * * *